(12) United States Patent
Lee

(10) Patent No.: US 7,524,738 B2
(45) Date of Patent: Apr. 28, 2009

(54) METHOD FOR MANUFACTURING SEMICONDUCTOR DEVICE

(75) Inventor: Hong Goo Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 25 days.

(21) Appl. No.: 11/321,539

(22) Filed: Dec. 30, 2005

(65) Prior Publication Data

US 2006/0234475 A1    Oct. 19, 2006

(30) Foreign Application Priority Data

Apr. 15, 2005    (KR) .................... 10-2005-0031486

(51) Int. Cl.
*H01L 21/00* (2006.01)
(52) U.S. Cl. ...................... 438/460; 438/462
(58) Field of Classification Search .................. 438/26, 438/39, 462, 106, 460
See application file for complete search history.

(56) References Cited

U.S. PATENT DOCUMENTS

| | | | | |
|---|---|---|---|---|
| 3,336,661 A | * | 8/1967 | Polinsky | 438/290 |
| 6,767,672 B2 | * | 7/2004 | Hong et al. | 430/5 |
| 2006/0019467 A1 | * | 1/2006 | Lee et al. | 438/462 |
| 2007/0037396 A1 | * | 2/2007 | Verhaverbeke | 438/689 |

FOREIGN PATENT DOCUMENTS

| | | |
|---|---|---|
| JP | 2003-332270 | 11/2003 |
| KR | 1995-0012592 | 5/1995 |

OTHER PUBLICATIONS

Stanley Wolf, Silicon Processing for the VLSI Era—vol. 1: Process Technology, 2000, Lattice Press, pp. 510-512; 841.*

* cited by examiner

*Primary Examiner*—W. David Coleman
*Assistant Examiner*—Vicki B Booker
(74) *Attorney, Agent, or Firm*—Townsend and Townsend and Crew LLP

(57) ABSTRACT

Disclosed herein is a method for manufacturing a semiconductor device. According to the present invention, a dummy contact hole is formed in a scribe lane by employing a direct polyimide etching ('DPE') process reducing the two steps of a masking process to one step and a passivation layer filling up the dummy contact hole is formed to mechanically support the stress generated in a subsequent annealing process, thereby preventing a crack as a particle source in a packaging process from occurring.

5 Claims, 5 Drawing Sheets

)# METHOD FOR MANUFACTURING SEMICONDUCTOR DEVICE

BACKGROUND OF THE INVENTION

1. Field of the Invention

The present invention relates to a memory device. In particular, the present invention provides a method for manufacturing a semiconductor device, and more specifically to a method for manufacturing a semiconductor device wherein a direct polyimide etching ('DPE') process reducing the two steps of a masking process to one step is employed, a dummy contact hole is formed on a metal line in a scribe lane of a semiconductor substrate, and then a passivation layer filling up the dummy contact hole is formed to mechanically support thermal stress generated in an annealing process, thereby preventing a crack as a particle source in a subsequent packaging process from occurring.

2. Discussion of the Related Art

FIGS. 1a and 1b are cross-sectional views illustrating a conventional method for manufacturing a semiconductor device.

In manufacturing a MOSFET device, a transistor and a capacitor are formed, and then a metal line to connect them with an outer circuit is formed. Thereafter, a passivation layer is formed in order to protect the device.

Next, a repair and process of forming and patterning a polymide to protect the semiconductor device is performed in order to open a pad and fuse box region for connecting a package. The repair and the process of forming and patterning a polymide is performed respectively using a repair mask 20 and a polymide mask 30 (referring to FIG. 1a). The repair and process of forming and patterning a polymide is required to two steps of making masks such as a repair mask and a polymide mask.

Recently, a direct polyimide etching ('DPE') process for opening a pad and fuse box region using one mask 40 instead of the repair and process of forming and patterning a polymide with two steps of a mask process has been proposed in order to reduce the number of process steps (referring to FIG. 1b).

FIGS. 2a and 2b are a cross-sectional view and a photograph showing a problem according to the conventional method for manufacturing a semiconductor device, respectively.

The DPE process makes the process for manufacturing a semiconductor device simple and improves a refresh characteristic of DRAM. However, referring to FIGS. 2a and 2b, a passivation layer 70 without an open area is deposited after a formation process for a metal line 50, and then an annealing process is performed onto the semiconductor substrate in an ambient of $H_2/N_2$. When a thin film deposited at a high temperature is cooled at a room temperature or an annealing process is sequentially performed onto the deposited thin film and a cooling process, the thin film receives a thermal stress from the annealing process. As a result, a crack such as a circle-shaped crack 'A', which serves as a particle source during a packaging process, is generated on the passivation layer 70.

According to a conventional method for manufacturing a semiconductor device, the passivation layer is formed on the metal line, and then the annealing process is performed onto the semiconductor substrate using $H_2/N_2$ to apply the thermal stress to a SOG (spin on glass ('SOD') layer for a passivation layer, thus generating a crack which serves as a particle source in a subsequent packaging process. As a result, the crack prevents the metal line from being connected, thus reducing the product yield for manufacturing the semiconductor device.

SUMMARY OF THE INVENTION

According to the present invention, techniques for a memory device are provided. In particular, the present invention provides a method for manufacturing a semiconductor device wherein a direct polyimide etching ('DPE') process reducing the two steps of a masking process to one step is employed, a dummy contact hole is formed on a metal line in a scribe lane of a semiconductor substrate, and then a passivation layer filling up the dummy contact hole is formed to mechanically support thermal stress generated in an annealing process, thereby preventing a crack as a particle source in a subsequent packaging process from occurring.

In order to achieve the above advantage, an embodiment of the present invention, a method for manufacturing a semiconductor device includes forming a metal line on a semiconductor substrate having a lower structure; forming at least one dummy contact hole on the metal line in a scribe lane of the semiconductor substrate; forming a passivation layer filling up the dummy contact hole; performing an annealing process onto the semiconductor substrate; and performing a package process.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts. It should be appreciated that the embodiments are provided for the purpose that one ordinarily skilled in the art would be able to understand the present invention, and modifications in various manners and the scope of the present invention are not limited by the embodiments described herein.

Figure 1A:
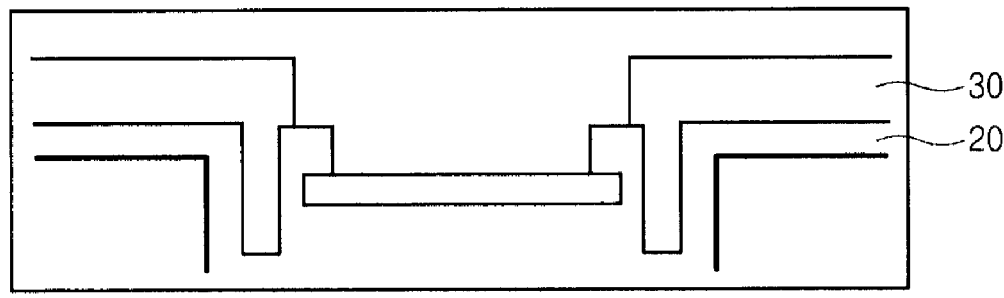
FIGS. 1a and 1b are cross-sectional views illustrating a conventional method for manufacturing a semiconductor device.
Figure 1B:
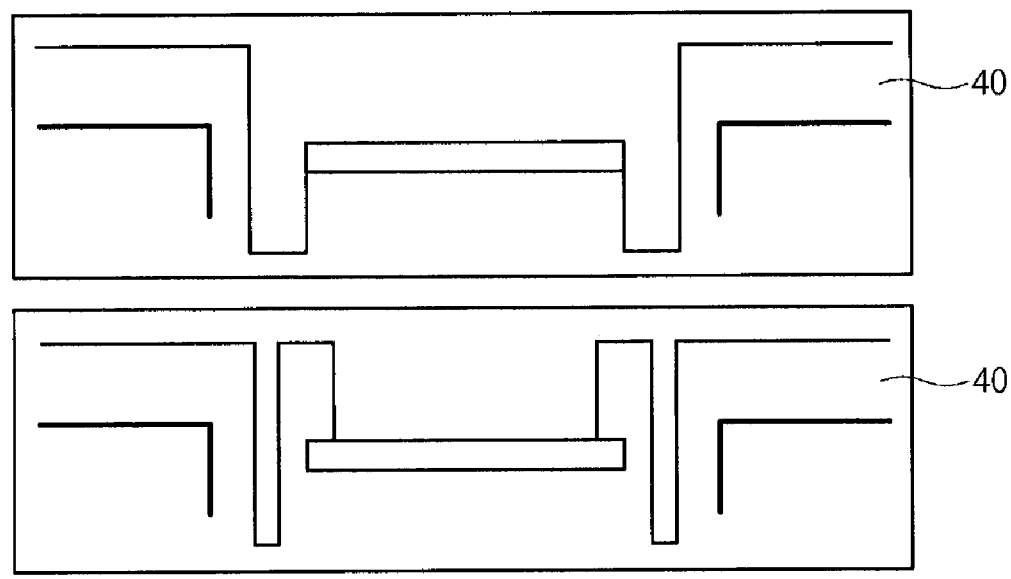
Figure 2A:
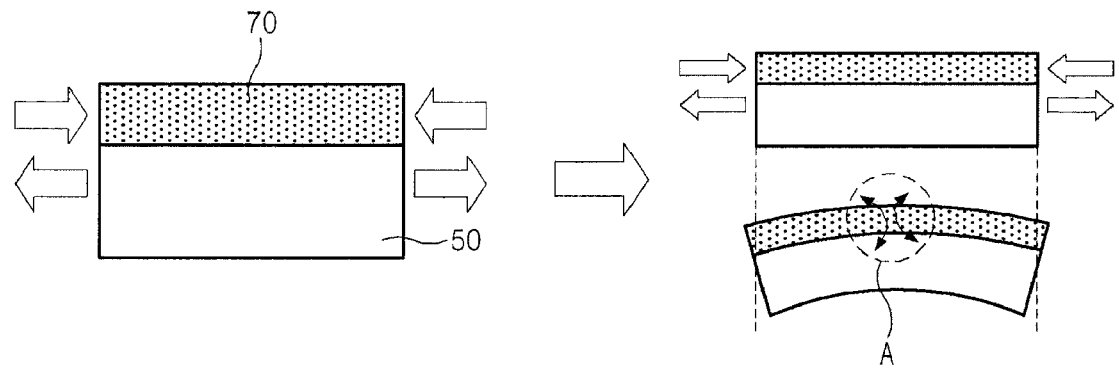
FIG. 2a is a cross-sectional view showing a problem according to a conventional method for manufacturing a semiconductor device.
Figure 2B:
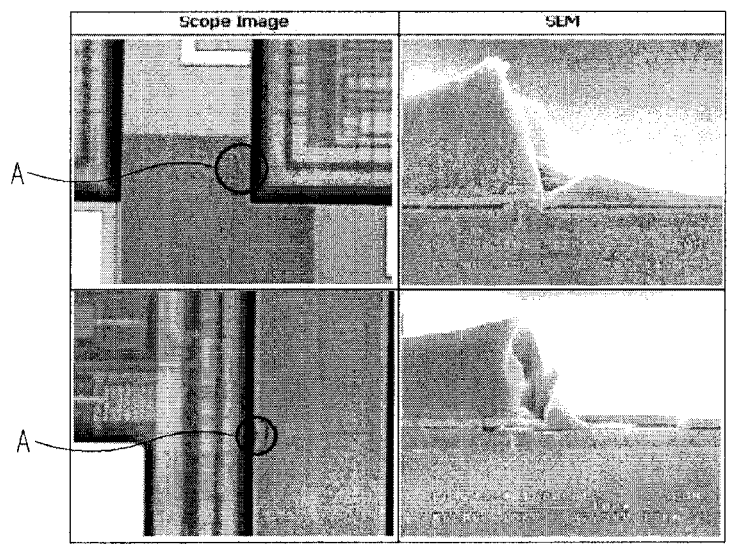
FIG. 2b is a photograph showing a problem according to a conventional method for manufacturing a semiconductor device.
Figure 3A:
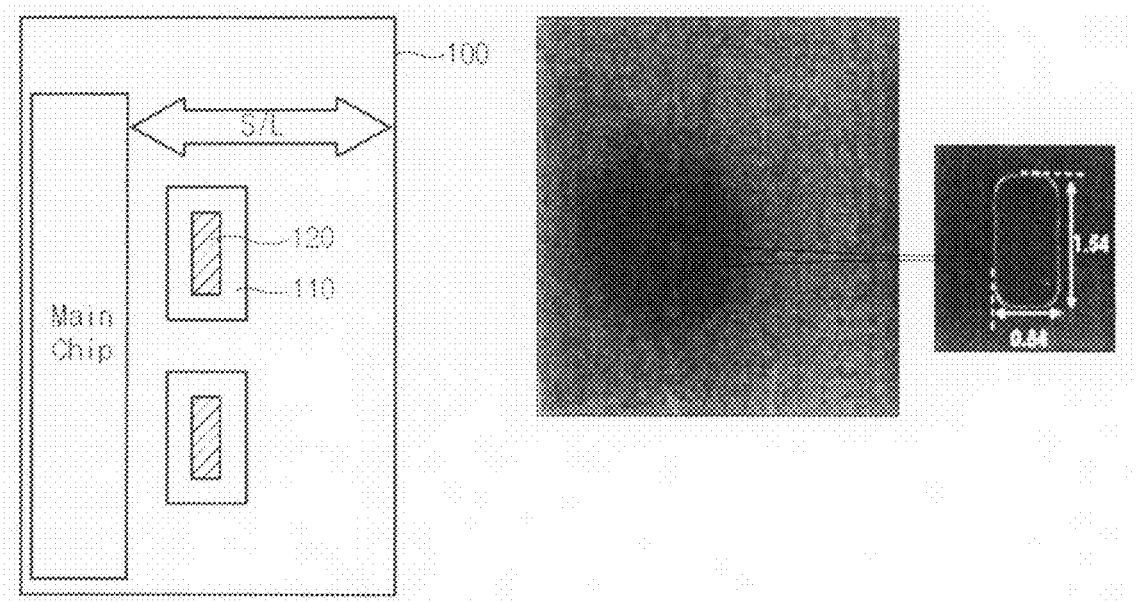
FIGS. 3a and 3b are top-views illustrating a semiconductor device according to an embodiment of the present invention.
Figure 3B:
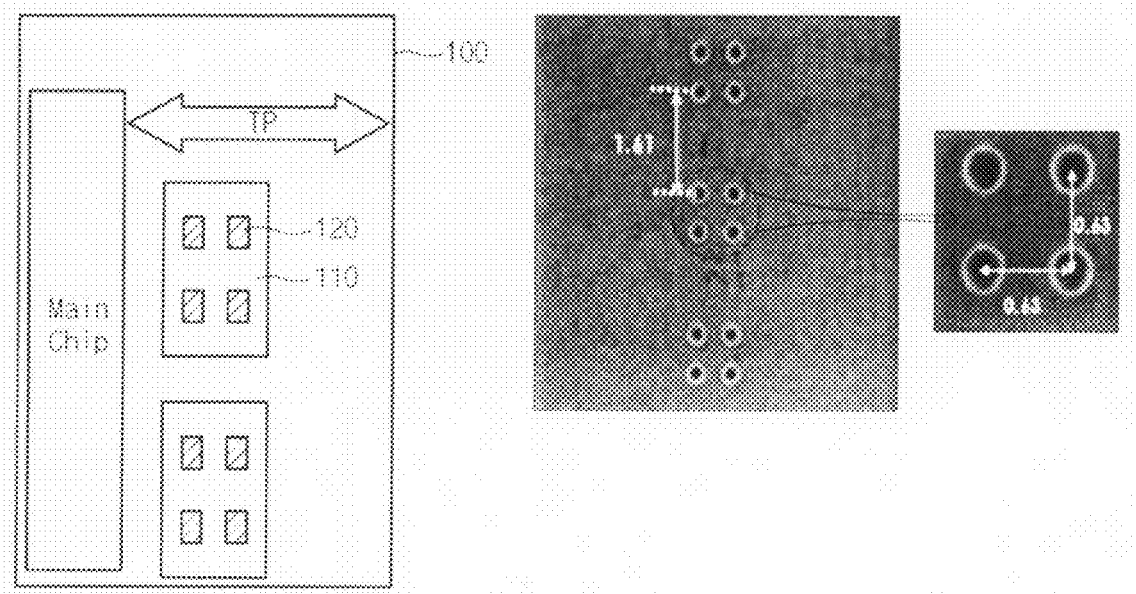
Figure 3C:
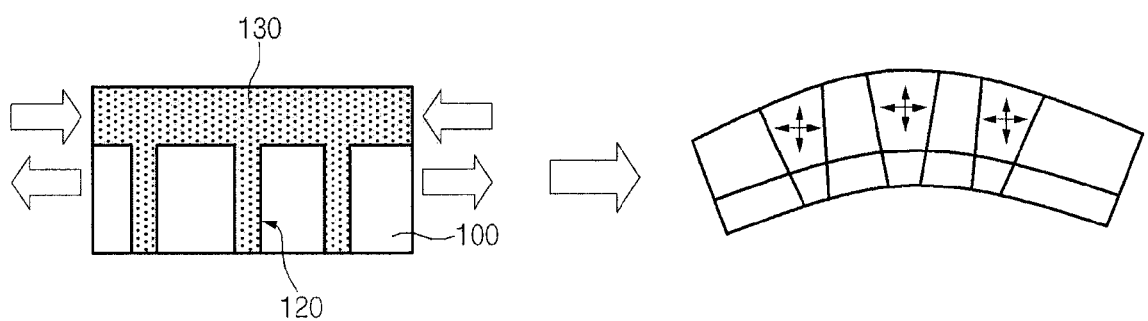
FIG. 3c is a cross-sectional view illustrating a method for manufacturing a semiconductor device according to an embodiment of the present invention.
Figure 3D:
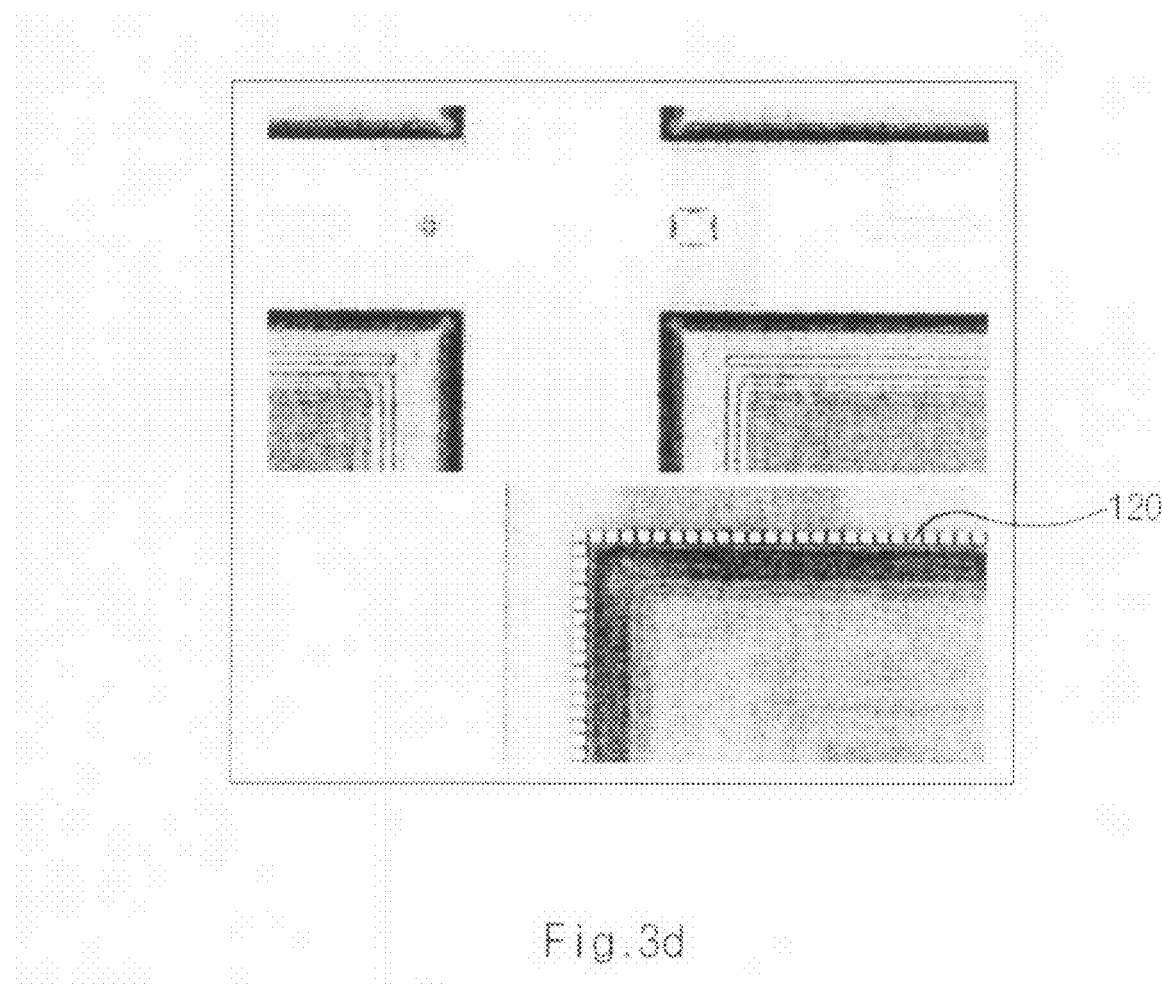
FIG. 3d is a photograph showing a semiconductor device according to an embodiment of the present invention.

FIGS. 3a and 3b are top-views illustrating a semiconductor device according to an embodiment of the present invention, FIG. 3c is a cross-sectional view illustrating a method for manufacturing a semiconductor device according to an embodiment of the present invention, and FIG. 3d is a photograph showing a semiconductor device according to an embodiment of the present invention.

Referring to FIGS. 3a and 3b, a metal line 110 is formed on a semiconductor substrate 100 having a lower structure such as a gate, a bit line, or a capacitor. Next, at least one dummy contact hole 120 is formed on the metal line 110 in a scribe lane ('S/L') or test pattern ('TP') of the semiconductor substrate 100. Here, the size of the dummy contact hole 120 ranges from 1 μm to 20 μm and its shape is a circle type (referring to the photograph in FIG. 3*b*), a line/space type, an elliptical type or a rectangular type (referring to FIG. 3*a*), preferably.

Referring to FIGS. 3*c* and 3*d*, a passivation layer 130 filling up the dummy contact hole 120 is formed on the semiconductor substrate 100 including the metal line, and then an annealing process is performed onto the semiconductor substrate 100. Here, the passivation layer 130 is selected from a group consisting of a SOG layer, a high density plasma ('HDP') oxide film, a nitride film and combinations thereof, preferably. The annealing process is performed in a gas atmosphere comprising $H_2/N_2$.

At this time, the dummy contact hole formed in the scribe lane mechanically supports thermal stress generated during the annealing process and has enough resistance for the thermal stress, which makes little strain and prevents a crack as a particle source in a subsequent packaging process from occurring.

According to a preferred embodiment of the present invention, while the DPE process is employed, the dummy contact hole is formed on the metal line in the scribe lane of the semiconductor substrate, and then the passivation layer filling up the dummy contact hole is formed to mechanically support the thermal stress generated in the annealing process, thereby preventing the crack as a particle source in a subsequent packaging process from occurring. As a result, there is an effect of reducing the product cost and yield for manufacturing the semiconductor device.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device comprising:
    forming a metal line on a semiconductor substrate having a lower structure;
    forming at least one dummy contact hole on the metal line in a scribe lane of the semiconductor substrate;
    forming a passivation layer filling up the at least one dummy contact hole on an entire surface of the semiconductor substrate; and
    performing an annealing process on the semiconductor substrate.

2. The method according to claim 1, wherein the size of the at least one dummy contact hole ranges from 1 μm to 20 μm.

3. The method according to claim 1, wherein the passivation layer comprises at least one of a spin-on-glass ('SOG') layer, a high density plasma oxide ('HDP') oxide film, a nitride film and combinations thereof.

4. The method according to claim 1, wherein the annealing process is performed in a gas atmosphere comprising $H_2/N_2$.

5. The method according to claim 4, wherein a shape of the dummy contact hole is a circle type, a line/space type, an elliptical type or a rectangular type.

\* \* \* \* \*